(12) United States Patent
Doberenz

(10) Patent No.: US 6,362,694 B1
(45) Date of Patent: Mar. 26, 2002

(54) METHOD AND APPARATUS FOR PROVIDING A RING OSCILLATOR

(75) Inventor: Philip W. Doberenz, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/540,479

(22) Filed: Mar. 31, 2000

(51) Int. Cl.[7] .................................................. H03B 5/02
(52) U.S. Cl. ........................ 331/57; 331/1 A; 327/166; 327/176
(58) Field of Search ................................ 327/258, 259, 327/291, 166, 176; 331/57

(56) References Cited

U.S. PATENT DOCUMENTS 6,094,081 A * 7/2000 Yanagiuchi .................. 327/258

* cited by examiner

Primary Examiner—Arnold Kinkead
(74) Attorney, Agent, or Firm—Kenyon & Kenyon

(57) ABSTRACT

A circuit for generating a clock signal is provided. The circuit includes a flip-flop having a first input and a second input. The flip-flop is operable to generate a first output signal and a second output signal. The circuit also includes a first delay chain and a second delay chain. The first delay chain is operable to receive the first output signal and generate a first delayed signal. The first delayed signal is then received by the first input of said flip-flop. The second delay chain is operable to receive the second output signal and generate a second delayed signal. The second delayed signal is then received by the second input of said flip-flop.

24 Claims, 5 Drawing Sheets

METHOD AND APPARATUS FOR PROVIDING A RING OSCILLATOR

BACKGROUND OF THE INVENTION

1. Field of the Invention

The present invention relates generally to clocking devices in digital circuits. More particularly, the present invention relates to providing a ring oscillator that may be operated without glitches.

2. Description of the Related Art

Digital circuits typically include digital components that operate in synchronism. In such systems, clocks are utilized to synchronize events between digital components such as flip-flops, multiplexers, adders, and multipliers. A clock generates a series of sequential square wave pulse signals that transition from a low state (i.e., logical "0") to a high state (i.e., logical "1"). The series of pulses, also known as a pulse train, is sent by the clock through conductive lines to each of the digital components to indicate when specific events must be performed. One type of circuit that generates a clock pulse train is known as a ring oscillator.

FIG. 1 is a circuit diagram of a typical ring oscillator 10. Ring oscillator 10 includes a NOT AND (NAND) gate 12 having an input coupled to an ENABLE signal and another input coupled to a loop 14. The output of NAND gate 12 is coupled to an input of a delay element 16. Delay element 16 includes a number of inverters 18 and generates an output signal. The output signal is then buffered by a buffer 20 before exiting ring oscillator 10. The output signal is also input to NAND gate 12 via loop 14. Delay element 16 generally includes an even number of inverters 18 to enable oscillation of the output signal. Although delay element 16 is shown with four inverters 18, it is well known in the art that either more or fewer inverters may be used depending on the amount of delay desired.

The operation of ring oscillator 10 is started when the ENABLE signal is asserted with a value of "1". NAND gate 12 compares the value of the ENABLE signal and the value of the output signal from loop 14 to generate a NAND signal, which is then input to delay element 16. Each inverter 18 then inverts the NAND output signal adding a delay on top of the NAND gate 12 delay with each inversion. Because there is an even number of inverters 18, the value of the output signal generated by delay element 16 is equal to that of the NAND signal.

If the ENABLE signal is not asserted, the output signal is suspended in a high state with a value of "1". When enabled, NAND gate 12 then generates a NAND signal with a value of "0" in the low state. After the NAND signal is inverted an even number of times by delay element 16, an output signal is generated with a value of "0". The output signal is then input into NAND gate 12 via loop 14 and a new NAND signal is generated with a value of "1". The cycle continues as long as the ENABLE signal is asserted to produce a clock pulse train. If the ENABLE signal is de-asserted, then the output signal will stop oscillating and return to being suspended in a high state.

Although ring oscillator 10 may be an adequate clocking device for applications with high error tolerance, it is prone to experiencing glitches that will cause problems in applications that are more sensitive. For example, ring oscillator 10 is unable to stop cleanly (synchronously) at the end of a half clock cycle. When the ENABLE signal is switched off to the low state, the clock signal is simply terminated whether or not the current half cycle has been completed.

Ring oscillator 10 also generates an improper clock if the ENABLE signal glitches low while loop 14 is in the high state. This type of error can be referred to as a "bubble", because it is analogized to a drinking straw with a bubble of air caught inside. The bubble moves with the flow of liquid in the straw. In the same manner, the electronic bubble continues to propagate around the loop. Therefore, errors can occur when the ENABLE signal experiences a glitch and shuts off for too short of a period of time before switching back on.

Another problem with ring oscillator 10 is that it does not provide for a convenient or easy method for altering characteristics of the clock signal. For example, the duty cycle of the clock (the amount of time that the clock signal is high versus the amount of time that the clock signal is low) may not be altered. Furthermore, the frequency of the clock may not easily be altered during the operation of ring oscillator 10 without causing a glitch.

In view of the foregoing, it is desirable to have a method and apparatus that provides for a ring oscillator that operates cleanly and is immune to glitches from outside signals. It is further desirable to have a ring oscillator where the duty cycle and frequency of the clock signal generated may be easily changed.

BRIEF DESCRIPTION OF THE DRAWINGS

The present invention will be readily understood by the following detailed description in conjunction with the accompanying drawings. To facilitate this description, like reference numerals designate like structural elements.

DETAILED DESCRIPTION

A method and apparatus for a glitchless ring oscillator is provided. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1:
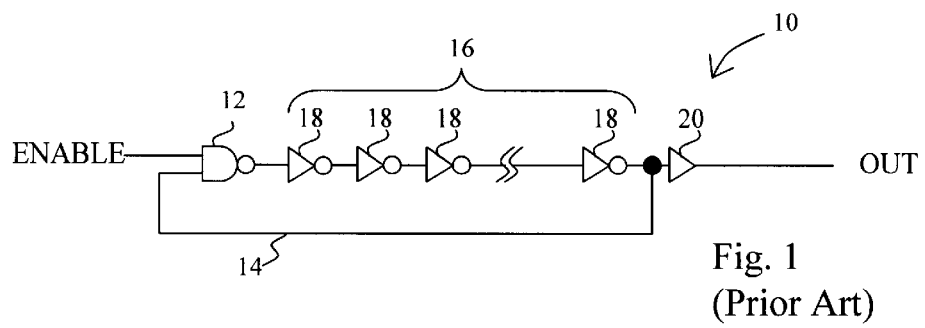
FIG. 1 is a circuit diagram of a typical ring oscillator.
Figure 2:
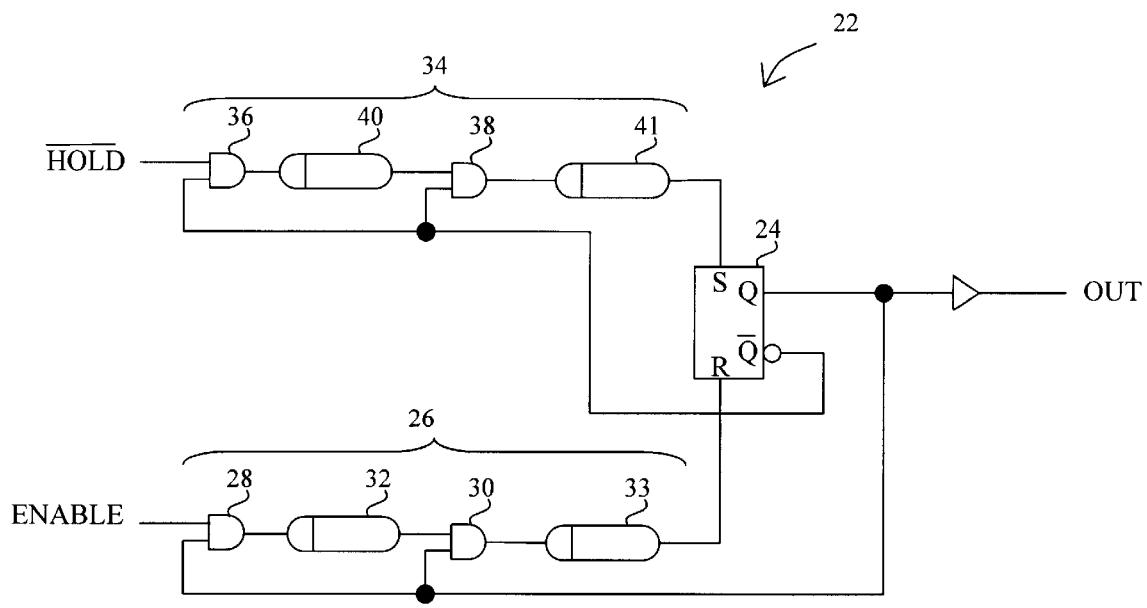
FIG. 2 is a circuit diagram of a glitchless ring oscillator in accordance with one embodiment of the present invention.

FIG. 2 is a circuit diagram of a glitchless ring oscillator 22 in accordance with one embodiment of the present invention. Glitchless ring oscillator 22 includes a flip-flop 24 having a first input, a second input, a first output, and a second output. Flip-flop 24 is preferably a set-reset (SR) flip-flop. However as is known in the art, other types of flip-flops may be used to provide the same results. As shown in FIG. 2, flip-flop 24 has a reset swith for a first input and a set switch for a second input. The first output of flip-flop 24 is designated by Q and the second output is designated by Q bar. A logic table for the operation of a SR flip-flop is shown below.

| S | R | Q   | Q bar |
|---|---|-----|-------|
| 0 | 0 | Q   | Q bar |
| 1 | 0 | 1   | 0     |
| 0 | 1 | 0   | 1     |
| 1 | 1 | N/A | N/A   |

The reset input of flip-flop 24 is coupled to an output of first delay chain 26, which includes a first AND gate 28 having a pair of inputs. One input of first AND gate 28 is coupled to an ENABLE signal and the other input is coupled to the Q output of flip-flop 24. The output of AND gate 28 goes to the input of delay element 32. First delay chain 26 further includes a second AND gate 30 having a pair of inputs. One input of second AND gate 30 is coupled to the Q output of flip flop 24 and the other input of second AND gate 30 is coupled to the output of delay element 32. The output of second AND gate 30 goes to the input of delay element 33. The delay elements may comprise any number of different circuit elements, including inverters or logic gates, for producing such a delay. Likewise these elements may be included in an integrated circuit (IC). The present invention is, of course, not limited in scope to the use of any particular type of delay element.

The set input of flip-flop 24 is coupled to an output of second delay chain 34, which includes a third AND gate 36 having a pair of inputs. One input of third AND gate 36 is coupled to a HOLD bar signal and the other input is coupled to the Q bar output of flip-flop 24. The output of third AND gate 36 goes to the input of delay element 40. Second delay chain 34 further includes a fourth AND gate 38 having a pair of inputs. One input of fourth AND gate 38 is coupled to the Q bar output of flip flop 24 and the other input of fourth AND gate 38 is coupled to the output of delay element 40. The output of AND gate 38 goes to the input of delay element 41. The second and fourth AND gates 30 and 38 in the middle of first and second delay chains 26 and 34 respectively are used to help clear out the delay chain faster. By splitting a delay chain with an AND gate in this manner, the delay chain will clear (fill with 0's) approximately twice as fast as it takes to fill it with 1's. For proper operation, each of the two delay chains must be cleared before they are enabled again. The time allowed to clear a delay chain, such as second delay chain 34, for example, is dependent on how long the other delay chain, first delay chain 26 takes to fill.

When it is desirable to achieve approximately 50% duty cycle of the output waveform, each of the two delay chains should have substantially equal delay times. It may be desirable however, for the delay chain's delay times to be unequal to achieve another desired output waveform. In this case, the longer delay chain may need to be split into more than two sections, each with a corresponding AND gate, to achieve fast enough clearing times. In cases where the delay chain have unequal delays, the shorter delay chain may not need to be split, with an AND gate in the middle, to achieve the goal of clearing out in time. Also, in the present embodiment of the invention, AND gates are used as a controlling gate in the delay chain. Alternately, other logic gates could be used with different logic polarities to achieve the same operation.

Figure 3:
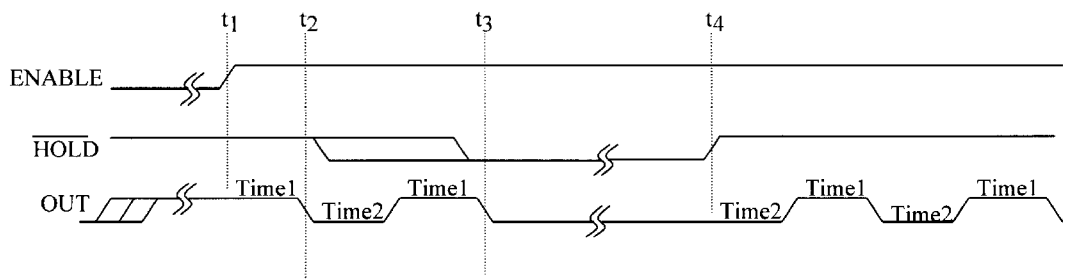
FIG. 3 is a timing diagram illustrating the operation of glitchless ring oscillator.

FIG. 3 is a timing diagram illustrating the operation of glitchless ring oscillator 22. Assuming before time $t_1$, that the ENABLE signal is held at a low state (i.e. a logical "0") and that the HOLD bar signal is held at a high state (i.e. a logical "1"), the Q output will eventually be suspended in a high state. This is because a low ENABLE signal input will generate a value of "0" from first AND gate 28 and second AND gate 30, eventually leaving the reset input of flip-flop 24 at a low state where it has no effect on the Q output.

If the Q output is low to start with, then Q bar will input a value of "1" to third AND gate 36 which evaluates to a value of "1" when HOLD bar is at a high state. The "1" will propagate down delay element 40 to the input of third AND gate 38. Third AND gate 38 will then output a "1", which will propagate through delay element 41 to be input to the set switch of flip-flop 24. The Q output will then be set to a high state and Q bar will be set to a low state. The "0" value of Q bar propagates through and "clears out" second delay chain 34 and changes the set input of flip-flop 24 to a low state. However, Q and Q bar remain constant at their previous values because the outputs are not affected when both the set and reset switches are at a low state.

At time $t_1$, the ENABLE switch is pulled to a high state and a value of "1" propagates through first delay chain 26 because the Q output also has a value of "1". The Q output of flip-flop 24 is input to both first AND gate 28 and second AND gate 30. First AND gate 24 evaluates to a high state, and after the delay time of delay element 32, causes second AND 30 gate to generate a value of "1", which propagates through delay element 33 thereby asserting the reset switch in flip-flop 24. The amount of time (Time1) for the value of "1" to propagate through first delay chain 26 may be controlled substantially by delay elements 32 and 33, which may be configured to add more or less delay. When the reset input is switched to a high state at time $t_2$, the Q output is reset to a value of "0" and the Q bar output generates a value of "1" at time $t_2$.

At time $t_2$, the Q bar output propagates a value of "1" down third AND gate 36 and second delay chain 34 in the same manner as described above with first delay chain 26. The amount of time (Time2) for propagation may be controlled by delay elements 40 and 41, which may be configured to add more or less delay. At the same time $t_2$, the Q output "clears out" first delay chain 26 by providing a value of "0" to one input of first AND gate 28 and second AND gate 30. After Time2 elapses, the set input of flip-flop 24 receives a value of "1" and sets the Q output with a value of "1".

One of the advantages of glitchless ring oscillator 22 over the prior art ring oscillator is that it is much less likely to be disrupted by error. During normal operation of glitchless ring oscillator 22 (when the ENABLE signal and the HOLD bar signal are at a high state), the Q output cycles between the high and low states thereby generating a clock signal. If either the ENABLE signal or the HOLD bar signal experience a glitch and revert to a low state for a short period of time, the clock signal is unaffected because switching either the set input or the reset input of flip-flop 24 to the low state does not change the Q output.

Glitchless ring oscillator 22 is also able to stop cleanly in synchronism unlike the prior art oscillator. The control signals, HOLD bar and ENABLE, are evaluated only at the start of the enabled period. When flip-flop 24 enables a particular delay chain, for example, first delay chain 26, once ENABLE becomes high, "1's" start propagating down the delay chain. If ENABLE goes low again, it doesn't stop the "1's" from continuing to propagate down the delay chain in a normal manner and eventually reset the flip-flop 24. If the control signal is allowed to asynchronously change, it's possible for the high pulse generated by first AND gate 28, in this example, to be too short to meet the required input characteristics of flip-flop 24. It may be desired to use pulse stretching techniques insure that the flip-flop requirements are always met. Such a circuit might use a multiple input OR gate where each input is tied into different taps of a particular delay chain. Alternatively, the control inputs could be synchronized with the clock.

Another advantage of the present invention is that both the duty cycle and the frequency of the clock signal may be modified without stopping the operation of ring oscillator 22. Because only one of the delay chains is in operation at a particular time, one delay chain may be altered during the operation of the other delay chain. The frequency of the clock signal may be altered by changing the delay in each delay chain by varying the number and strength of the delay elements. The duty cycle may be changed by varying the ratio of delays of the two delay chains. If one chain is shorter than the other chain, the long chain may require more AND gates, spaced along the length of the longer chain, so that it clears out in time.

Figure 4:
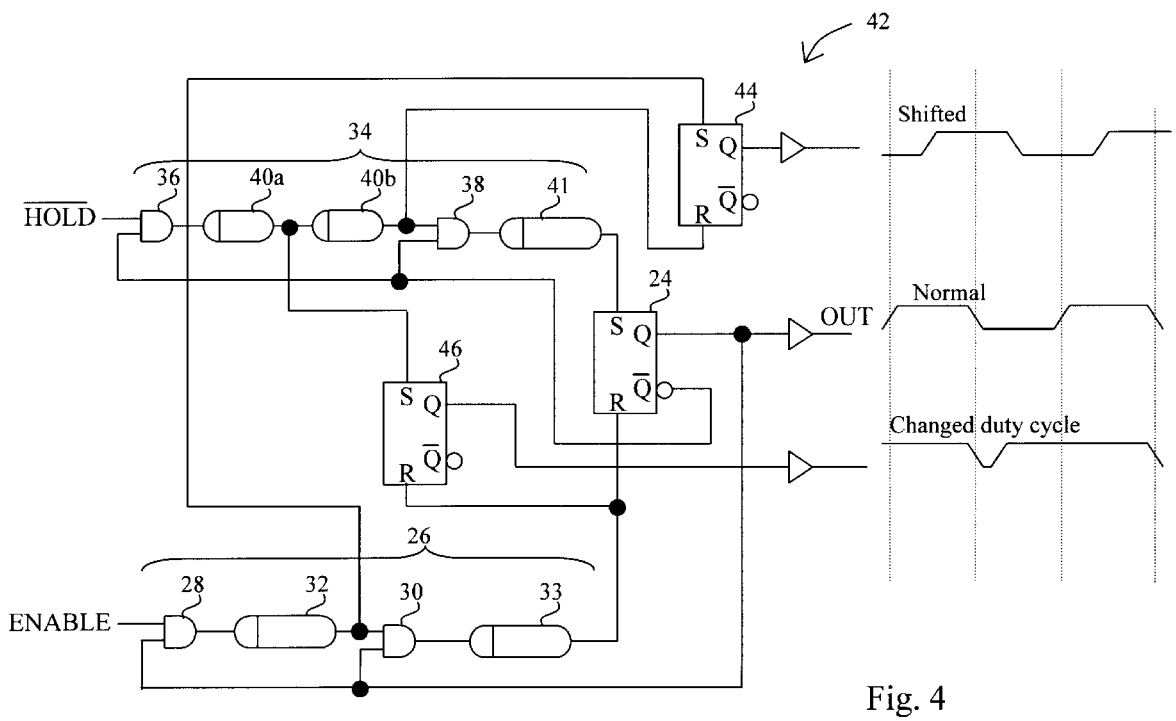
FIG. 4 is a circuit diagram of multiple-output ring oscillator in accordance with one embodiment of the present invention.

FIG. 4 is a circuit diagram of multiple-output ring oscillator 42 in accordance with one embodiment of the present invention. Multiple-output oscillator 42 is similar to ring oscillator 22, but further includes a flip-flop 44 and a flip-flop 46, which have their set and reset inputs connected to various taps of delay chains 26 and 34. In this embodiment, delay element 40 has been split into two delay sections, 40a and 40b, to provide additional timing resolution. Flip-flop 24 still controls the operation of multiple-output ring oscillator 42, and sets the frequency, but by using flip-flops 44 and 46 that tap into delay chains 26 and 34 at different points, control of phase and duty cycle of individual outputs is easily obtained. Flip- flop 44 connects to taps equally spaced along the two delay chains, and so its phase is shifted with respect to flip-flop 24's output. Flip-flop 46 connects to unequal taps, so its duty cycle is different with respect to flip-flop 24's output.

Figure 5:
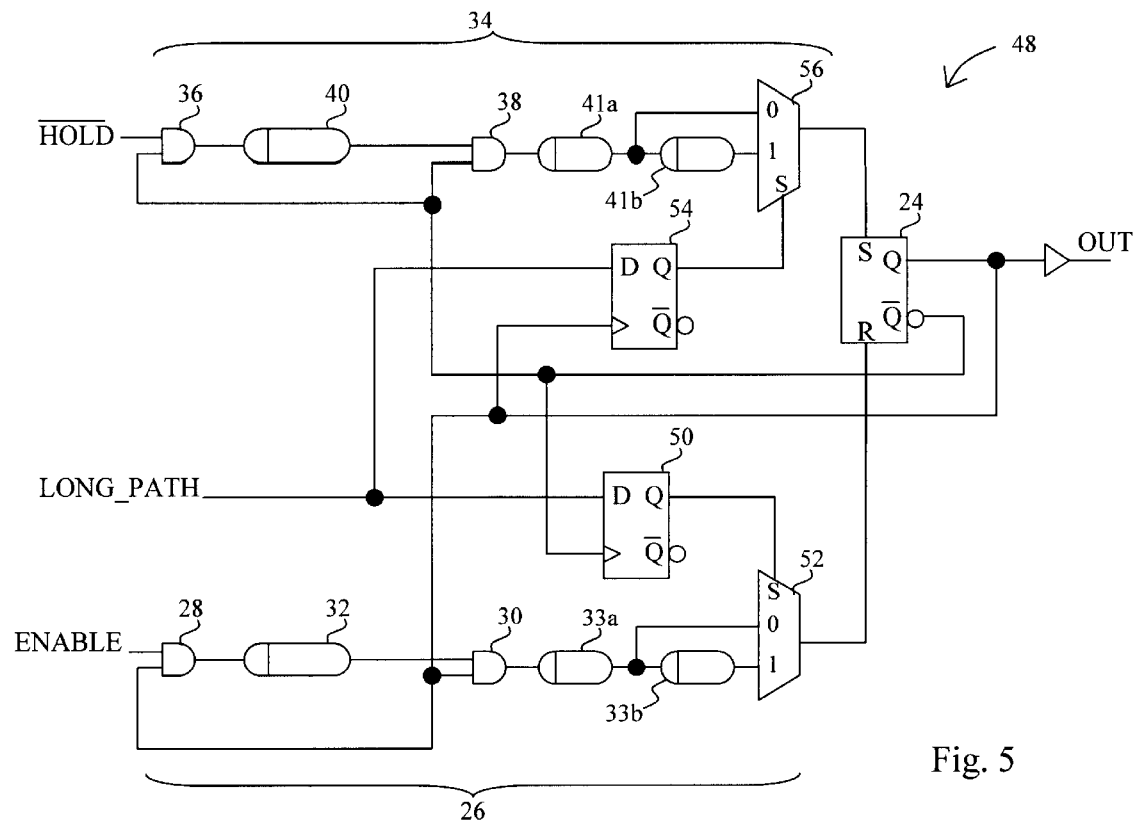
FIG. 5 is a circuit diagram of a delay-switching oscillator in accordance with one embodiment of the present invention.

FIG. 5 is a circuit diagram of a delay-switching oscillator 48 in accordance with one embodiment of the present invention. Delay switching oscillator 48 is similar to glitch-less ring oscillator 22, but further includes a flip-flop 50 having a D input, a clock input, and a Q output. The D input is coupled to a LONG_PATH signal, which is used to switch delay elements 33b and 41b in and out of operation. The clock input of flip-flop 50 is coupled to the Q bar output of flip-flop 24 to ensure that flip-flop 50 will only operate when first delay chain 26 is not being used. The Q output of flip-flop 50 is coupled to a select input of a multiplexer 52 having a "0" input and a "1" input. Multiplexer 52 has a "0" input coupled to delay element 33a, a "1" input coupled to delay element 33b, and an output to the reset input of flip-flop 24.

Delay switching oscillator 48 also incudes a flip-flop 54 having a D input, a clock input, and a Q output. The D input is coupled to a $LONG_{13}$ PATH signal. The clock input of flip-flop 54 is coupled to the Q output of flip-flop 24 to ensure that flip-flop 50 will only operate when second delay chain 34 is not being used. The Q output of flip-flop 54 is coupled to a select input of a multiplexer 56 having a "0" input and a "1" input. Multiplexer 56 has a "0" input coupled to delay element 41a, a "1" input coupled to delay element 41b and an output coupled to the set input of flip-flop 24. While this embodiment shows where both delay paths have the ability to change delays, it may be desired that only one path has this capability.

Figure 6:
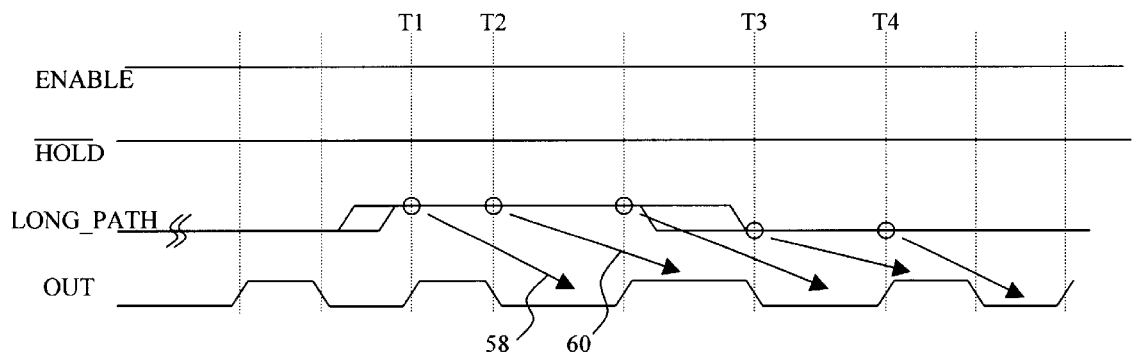
FIG. 6 is a timing diagram of delay switching oscillator.

FIG. 6 is a timing diagram of delay switching oscillator 48. As the $LONG_{13}$ PATH signal is high at time T1, flip-flop 54 outputs a value of "1" to multiplexer 56 on the rising edge of the Q output of flip-flop 24. Multiplexer 52 then switches delay element 41b into the operation of second delay chain 34. On the next half cycle before the Q output of flip-flop 24 evaluates to a "1", delay element 41b is used to cause an added delay as indicated by an arrow 58. At time T2, flip-flop 50 outputs the value of "1" to multiplexer 52 on the rising edge of the Q bar output of flip-flop 24. Multiplexer 52 then switches buffer 33b into the operation of first delay chain 26. On the next half cycle before the Q output of flip-flop 24 evaluates to a "0", buffer 33b is used to cause an added delay as indicated by an arrow 60.

Figure 7:
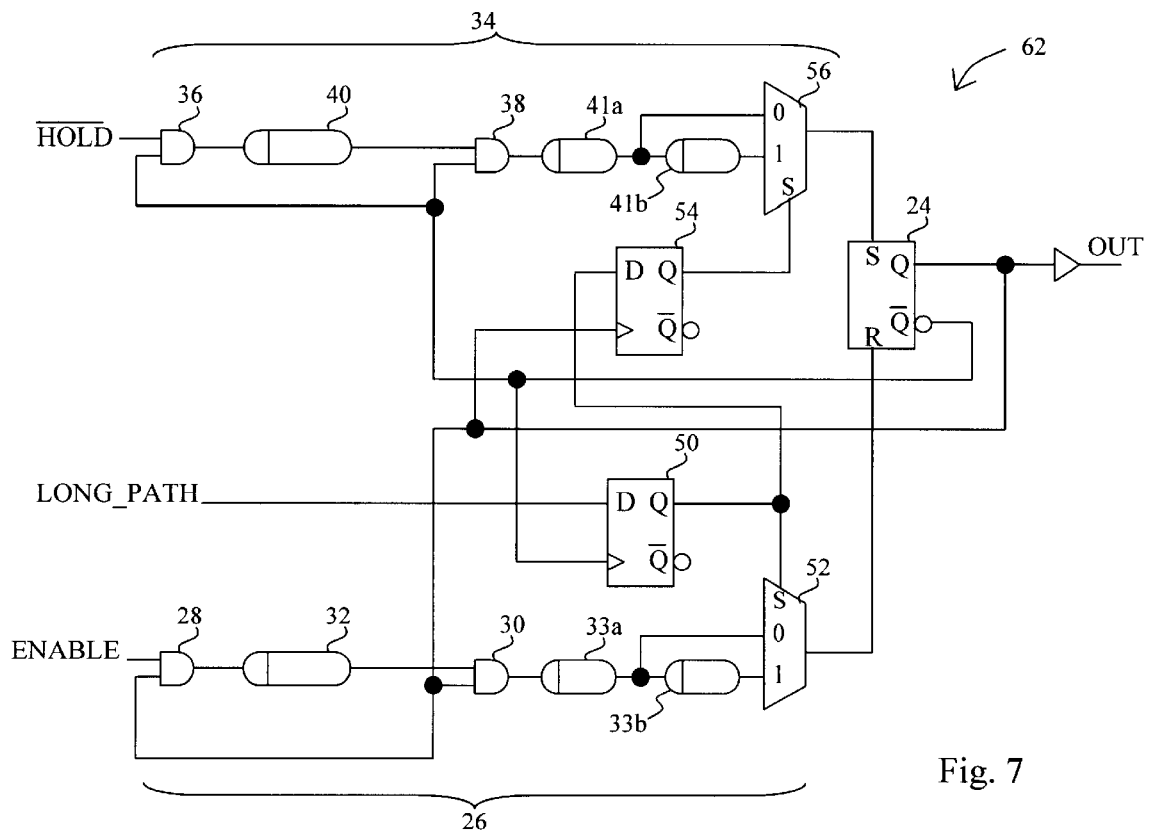
FIG. 7 is a circuit diagram of another delay switching oscillator in accordance with one embodiment of the present invention.
Figure 8:
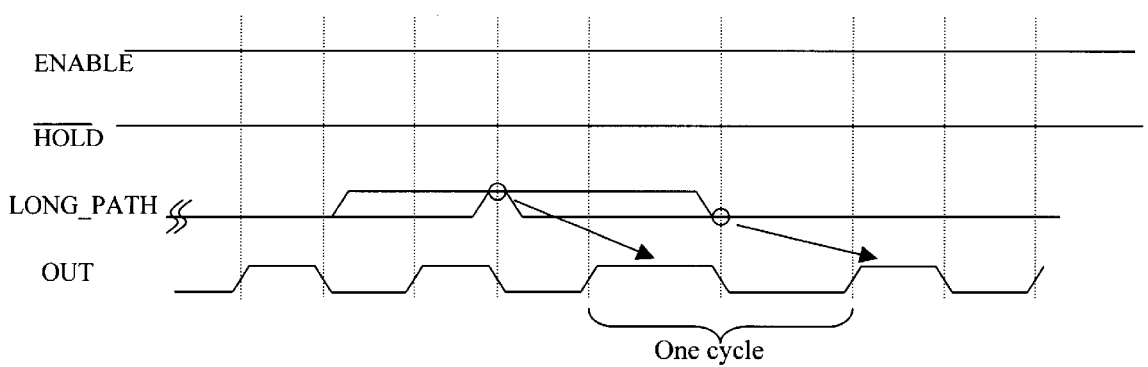
FIG. 8 is a circuit diagram and a timing diagram of another delay switching oscillator in accordance with one embodiment of the present invention.

FIGS. 7 and 8 are a circuit diagram and a timing diagram of another delay switching oscillator 62 in accordance with one embodiment of the present invention. Delay switching oscillator 62 is similar to delay switching oscillator 48, however the D input of flip-flop 54 is coupled to the Q output of flip-flop 50. In this configuration, the delay is changed on a cycle by cycle basis as shown in FIG. 8, instead of sampling the $LONG_{13}$ PATH signal every half cycle.

Figure 9:
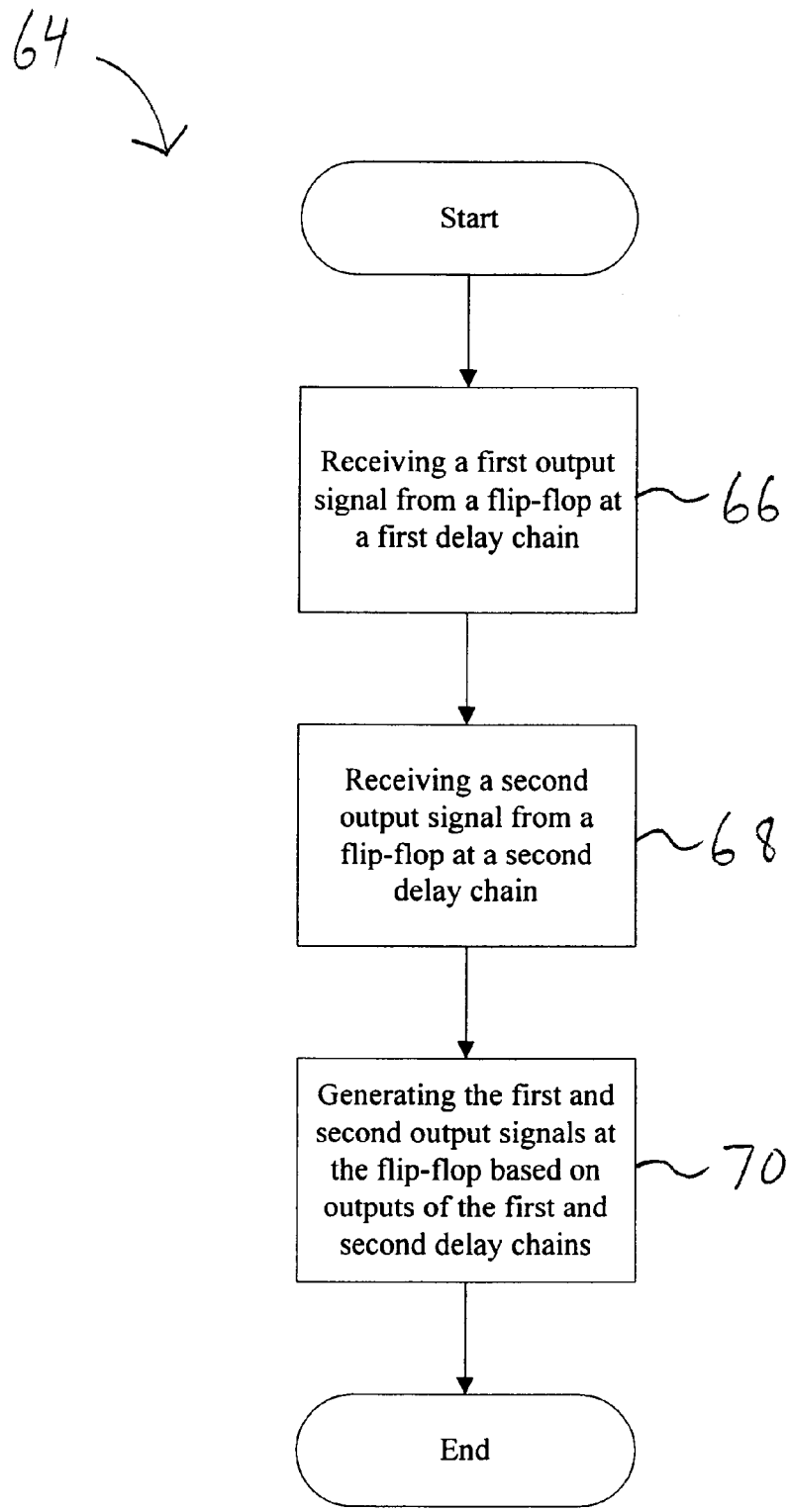
FIG. 9 is a flow chart of the method for providing a clock signal.

FIG. 9 is a flow chart of a method 64 for providing a clock signal. Method 64 begins by receiving a first output signal from a flip-flop at a first delay chain in a block 66. The first delay chain preferably includes a first AND gate and a second AND gate, which are operable to receive the first output signal. The first AND gate is also preferably operable to receive an ENABLE signal. A second output signal is then received from the flip-flop at a second delay chain in a block 68. The second delay chain preferably includes a third AND gate and a fourth AND gate, which are operable to receive the second output signal. Third AND gate is also preferably operable to receive a hold signal. The first and second output signals are generated at the flip-flop based on the outputs of the first and second delay chains in a block 70. In addition to the first and second output signals, a third output signal may be generated by an additional flip-flop. The third output signal may be time shifted relative to the first output signal or have a different duty cycle than the first output signal.

Other embodiments of the invention will be apparent to those skilled in the art from consideration of the specification and practice of the invention. Furthermore, certain terminology has been used for the purposes of descriptive clarity, and not to limit the present invention. The embodiments and preferred features described above should be considered exemplary, with the invention being defined by the appended claims.

What is claimed is:

1. A circuit for providing a clock signal comprising:
   a flip-flop having a first input and a second input, wherein said flip-flop is operable to generate a first output signal and a second output signal;
   a first delay chain, wherein said first delay chain includes a first AND gate operable to receive said first output signal and wherein said first delay chain is operable to generate a first delayed signal to be received by said first input of said flip-flop; and
   a second delay chain, wherein said second delay chain is operable to receive said second output signal and generate a second delayed signal to be received by said second input of said flip-flop.

2. A circuit as recited in claim 1, wherein the first delay chain includes a second AND gate operable to receive the first output signal of the flip-flop and to receive an output of the first AND gate.

3. A circuit as recited in claim 2, wherein the second delay chain includes a third AND gate and a fourth AND gate operable to receive the second output signal.

4. A circuit as recited in claim 3, wherein the fourth AND gate is further operable to receive an output of the third AND gate.

5. A circuit as recited in claim 4, wherein said first AND gate is operable to receive an ENABLE signal and wherein said third AND gate is operable to receive a HOLD bar signal.

6. A circuit as recited in claim 5, wherein the first delay chain includes a first number of delay elements and the second delay chain includes a second number of delay elements.

7. A circuit as recited in claim 6, wherein said flip-flop is a set-reset flip-flop.

8. A circuit as recited in claim 7, further comprising a second flip-flop having a reset input coupled to the first delay chain and a set input coupled to the second delay chain, wherein said second flip-flop generates a clock signal that is phase shifted relative to the clock signal generated by the first flip-flop.

9. A circuit as recited in claim 7, further comprising a second flip-flop having a reset input coupled a first point on one of the first or second delay chains and a set input coupled to a second point on one of the first or second delay chains, wherein said second flip-flop generates a clock signal that has a different duty cycle than the clock signal generated by the first flip-flop.

10. A method for providing a clock signal comprising:
    receiving a first output signal from a flip-flop at a first delay chain, wherein said first delay chain includes a first AND gate and a second AND gate operable to receive said first output signal;
    receiving a second output signal from said flip-flop at a second delay chain;
    generating said first and second output signals at said flip-flop based on outputs of said first and second delay chains.

11. The method of claim 10, wherein the second delay chain includes a third AND gate and a fourth AND gate operable to receive the second output signal.

12. The method of claim 11, wherein said first AND gate is operable to receive an ENABLE signal and wherein the third AND gate is operable to receive a HOLD bar signal.

13. The method of claim 12, further comprising generating a third output at a second flip-flop based on outputs of the first and second delay chains, wherein said third output is shifted relative to the first output signal.

14. The method of claim 13, further comprising generating a third output at a second flip-flop based on outputs of the first and second delay chains, wherein said third output has a different duty cycle than the first output signal.

15. A circuit for providing a clock signal comprising:
    a first flip-flop having a first input and a second input, wherein said first flip-flop is operable to generate a first output signal and a second output signal;
    a first delay chain having a first multiplexer, wherein said first multiplexer is operable to change a delay of said first delay chain, wherein said first delay chain includes a first AND gate operable to receive said first output signal and wherein said first delay chain is operable to generate a first delayed signal to be received by said first input of said first flip-flop; and
    a second delay chain, wherein said second delay chain is operable to receive said second output signal and generate a second delayed signal to be received by said second input of said first flip-flop.

16. A circuit as recited in claim 15, wherein the first delay chain includes a second AND gate operable to receive the first output signal of the flip-flop and to receive an output of the first AND gate.

17. A circuit as recited in claim 16, wherein the second delay chain includes a third AND gate and a fourth AND gate operable to receive the second output signal.

18. A circuit as recited in claim 17, wherein the fourth AND gate is further operable to receive an output of the third AND gate.

19. A circuit as recited in claim 18, wherein said first AND gate is operable to receive an ENABLE signal and wherein said third AND gate is operable to receive a HOLD bar signal.

20. A circuit as recited in claim 19, wherein the first delay chain includes a delay element and the second delay chain includes a second delay element.

21. A circuit as recited in claim 20, further including a second flip-flop having a third input and a fourth input, wherein said second flip-flop is operable to generate a third output signal to be received by a select input of the first multiplexer.

22. A circuit as recited in claim 21, wherein the third input of the second flip-flop is coupled to a $LONG_{13}$ PATH signal and the fourth input is a clock input operable to receive the second output signal of the first flip-flop.

23. A circuit as recited in claim 22, further including:
    a second multiplexer, wherein said second multiplexer is operable to change a delay of second delayed signal; and
    a third flip-flop having a fifth and sixth input, wherein said third flip-flop is operable to generate a fourth output signal to be received by a select input of said second multiplexer.

24. A circuit as recited in claim 23, wherein the fifth input of the third flip-flop is coupled to a $LONG_{13}$ PATH signal and the sixth input is a clock input operable to receive the first output signal of the first flip-flop.

* * * * *